(12) United States Patent
Rathburn

(10) Patent No.: US 8,618,649 B2
(45) Date of Patent: Dec. 31, 2013

(54) COMPLIANT PRINTED CIRCUIT SEMICONDUCTOR PACKAGE

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 0 days.

(21) Appl. No.: 13/318,263

(22) PCT Filed: May 27, 2010

(86) PCT No.: PCT/US2010/036285
§ 371 (c)(1),
(2), (4) Date: Oct. 31, 2011

(87) PCT Pub. No.: WO2010/141296
PCT Pub. Date: Dec. 9, 2010

(65) Prior Publication Data
US 2012/0043667 A1     Feb. 23, 2012

Related U.S. Application Data

(60) Provisional application No. 61/183,348, filed on Jun. 2, 2009.

(51) Int. Cl.
*H01L 23/48*     (2006.01)
*H01L 23/52*     (2006.01)

(52) U.S. Cl.
USPC .......................................... 257/688; 257/774

(58) Field of Classification Search
USPC .................. 257/E21.596, E21.599, 688, 774; 438/68, 113, 114, 458, 460–465, 438/FOR. 386
See application file for complete search history.

(56) References Cited

U.S. PATENT DOCUMENTS

| | | | |
|---|---|---|---|
| 3,672,986 A | 6/1972 | Schneble, Jr. et al. |
| 4,188,438 A | 2/1980 | Burns |

(Continued)

FOREIGN PATENT DOCUMENTS

| | | |
|---|---|---|
| JP | 2003/217774 | 7/2003 |
| WO | WO 91/14015 | 9/1991 |

(Continued)

OTHER PUBLICATIONS

Notification of Transmittal of the International Search Report and the Written Opinion of the International Searching Authority mailed Feb. 8, 2012 in International Application No. PCT/US2011/0.

(Continued)

*Primary Examiner* — Julio J Maldonado
*Assistant Examiner* — Cory Eskridge
(74) *Attorney, Agent, or Firm* — Stoel Rives LLP

(57) ABSTRACT

A package for at least one semiconductor device and a method for making the package. At least one dielectric layer is selectively printed on at least a portion of the semiconductor device creating first recesses aligned with a plurality of the electrical terminals. A conductive material is printed in the first recesses forming contact members on the semiconductor device. At least one dielectric layer is selectively printed on at least a portion of the package to create a plurality of second recesses corresponding to a target circuit geometry. A conductive material is printed in at least a portion of the second recesses to create a circuit geometry. The circuit geometry includes a plurality of exposed terminals electrically coupled to the electric terminals on the semiconductor device.

19 Claims, 13 Drawing Sheets

(56) References Cited

U.S. PATENT DOCUMENTS

| | | | |
|---|---|---|---|
| 4,489,999 A | 12/1984 | Miniet | |
| 4,922,376 A | 5/1990 | Pommer et al. | |
| 4,964,948 A | 10/1990 | Reed | |
| 5,014,159 A * | 5/1991 | Butt | 361/717 |
| 5,161,983 A | 11/1992 | Ohno | |
| 5,237,203 A | 8/1993 | Massaron | |
| 5,286,680 A | 2/1994 | Cain | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,659,181 A | 8/1997 | Bridenbaugh | |
| 5,716,663 A | 2/1998 | Capote et al. | |
| 5,741,624 A | 4/1998 | Jeng et al. | |
| 5,761,801 A | 6/1998 | Gebhardt et al. | |
| 5,791,911 A | 8/1998 | Fasano et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,933,558 A | 8/1999 | Sauvageau et al. | |
| 6,080,932 A | 6/2000 | Smith et al. | |
| 6,118,426 A | 9/2000 | Albert | |
| 6,120,588 A | 9/2000 | Jacobson | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,247,938 B1 | 6/2001 | Rathburn | |
| 6,252,564 B1 | 6/2001 | Albert | |
| 6,263,566 B1 | 7/2001 | Hembree et al. | |
| 6,270,363 B1 | 8/2001 | Brofman et al. | |
| 6,312,971 B1 | 11/2001 | Amundson | |
| 6,313,528 B1 * | 11/2001 | Solberg | 257/723 |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,574,114 B1 | 6/2003 | Brindle et al. | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,744,126 B1 * | 6/2004 | Chiang | 257/686 |
| 6,750,473 B2 | 6/2004 | Amundson | |
| 6,750,551 B1 | 6/2004 | Frutschy et al. | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,861,345 B2 | 3/2005 | Ball et al. | |
| 6,910,897 B2 | 6/2005 | Driscoll et al. | |
| 6,967,640 B2 | 11/2005 | Albert | |
| 6,971,902 B2 | 12/2005 | Taylor | |
| 7,045,015 B2 | 5/2006 | Renn | |
| 7,101,210 B2 | 9/2006 | Lin | |
| 7,114,960 B2 | 10/2006 | Rathburn | |
| 7,121,839 B2 * | 10/2006 | Rathburn | 439/66 |
| 7,148,128 B2 | 12/2006 | Jacobson | |
| 7,157,799 B2 | 1/2007 | Noquil et al. | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,244,967 B2 | 7/2007 | Hundt et al. | |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,382,363 B2 | 6/2008 | Albert et al. | |
| 7,410,825 B2 | 8/2008 | Majumdar et al. | |
| 7,411,304 B2 | 8/2008 | Kirby et al. | |
| 7,417,299 B2 | 8/2008 | Hu | |
| 7,417,314 B1 | 8/2008 | Lin et al. | |
| 7,422,439 B2 | 9/2008 | Rathburn et al. | |
| 7,423,219 B2 | 9/2008 | Kawaguchi et al. | |
| 7,458,150 B2 | 12/2008 | Totokawa et al. | |
| 7,485,345 B2 | 2/2009 | Renn | |
| 7,508,076 B2 | 3/2009 | Japp et al. | |
| 7,537,461 B2 | 5/2009 | Rathburn | |
| 7,538,415 B1 * | 5/2009 | Lin et al. | 257/673 |
| 7,548,430 B1 | 6/2009 | Huemoeller et al. | |
| 7,632,106 B2 | 12/2009 | Nakamura | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,800,916 B2 | 9/2010 | Blackwell et al. | |
| 7,833,832 B2 | 11/2010 | Wood et al. | |
| 7,897,503 B2 | 3/2011 | Foster et al. | |
| 7,898,087 B2 | 3/2011 | Chainer | |
| 8,148,643 B2 | 4/2012 | Hirose et al. | |
| 8,154,119 B2 | 4/2012 | Yoon et al. | |
| 8,158,503 B2 | 4/2012 | Abe | |
| 8,159,824 B2 | 4/2012 | Cho et al. | |
| 8,232,632 B2 | 7/2012 | Rathburn | |
| 8,344,516 B2 | 1/2013 | Chainer | |
| 8,373,428 B2 | 2/2013 | Eldridge et al. | |
| 8,525,346 B2 | 9/2013 | Rathburn | |
| 2001/0012707 A1 | 8/2001 | Ho et al. | |
| 2001/0016551 A1 | 8/2001 | Yushio et al. | |
| 2002/0011639 A1 | 1/2002 | Carlson et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0114029 A1 | 6/2003 | Lee et al. | |
| 2003/0117161 A1 | 6/2003 | Burns | |
| 2003/0156400 A1 | 8/2003 | Dibene et al. | |
| 2003/0162418 A1 | 8/2003 | Yamada | |
| 2003/0188890 A1 | 10/2003 | Bhatt et al. | |
| 2004/0029411 A1 | 2/2004 | Rathburn | |
| 2004/0048523 A1 | 3/2004 | Huang et al. | |
| 2004/0054031 A1 | 3/2004 | Jacobson | |
| 2004/0070042 A1 | 4/2004 | Lee et al. | |
| 2004/0077190 A1 | 4/2004 | Huang et al. | |
| 2004/0174180 A1 | 9/2004 | Fukushima et al. | |
| 2004/0183557 A1 | 9/2004 | Akram | |
| 2004/0184219 A1 | 9/2004 | Otsuka et al. | |
| 2004/0217473 A1 | 11/2004 | Shen | |
| 2004/0243348 A1 | 12/2004 | Minatani | |
| 2005/0048680 A1 | 3/2005 | Matsunami | |
| 2005/0101164 A1 | 5/2005 | Rathburn | |
| 2005/0164527 A1 | 7/2005 | Radza et al. | |
| 2006/0001152 A1 | 1/2006 | Hu | |
| 2006/0012966 A1 | 1/2006 | Chakravorty | |
| 2006/0024924 A1 | 2/2006 | Haji et al. | |
| 2006/0044357 A1 | 3/2006 | Andersen | |
| 2006/0087064 A1 | 4/2006 | Daniel et al. | |
| 2006/0157103 A1 | 7/2006 | Sheats et al. | |
| 2006/0160379 A1 | 7/2006 | Rathburn | |

(56) References Cited

U.S. PATENT DOCUMENTS

| | | |
|---|---|---|
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0265919 A1 | 11/2006 | Huang |
| 2007/0145981 A1 | 6/2007 | Tomita et al. |
| 2007/0148822 A1* | 6/2007 | Haba et al. ............... 438/110 |
| 2007/0170595 A1 | 7/2007 | Sinha |
| 2007/0221404 A1 | 9/2007 | Das et al. |
| 2007/0232059 A1 | 10/2007 | Abe |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0057753 A1 | 3/2008 | Rathburn et al. |
| 2008/0073110 A1 | 3/2008 | Shioga et al. |
| 2008/0093115 A1 | 4/2008 | Lee |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0220584 A1 | 9/2008 | Kim et al. |
| 2008/0241997 A1 | 10/2008 | Sunohara et al. |
| 2008/0246136 A1* | 10/2008 | Haba et al. ............... 257/686 |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2009/0039496 A1* | 2/2009 | Beer et al. ............... 257/693 |
| 2009/0058444 A1 | 3/2009 | McIntyre |
| 2009/0061089 A1 | 3/2009 | King |
| 2009/0065918 A1 | 3/2009 | Murphy |
| 2009/0127698 A1 | 5/2009 | Rathburn |
| 2009/0224404 A1 | 9/2009 | Wood et al. |
| 2009/0241332 A1 | 10/2009 | Lauffer et al. |
| 2010/0022105 A1 | 1/2010 | Di Stefano |
| 2010/0133680 A1 | 6/2010 | Kang et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |

OTHER PUBLICATIONS

Notification of Transmittal of the International Search Report and the Written Opinion of the International Searching Authority mailed Mar. 26, 2012 in International Application No. PCT/US2011/062313.

Co-pending U.S. Appl. No. 13/410,914, titled Metalized Pad to Electrical Contact Interface, filed Mar. 2, 2012.

Co-pending U.S. Appl. No. 13/410,943, titled Area Array Semiconductor Device Package Interconnect Structure With Optional Package-to-Package or Flexible Circuit to Package Connection, filed Mar. 2, 2012.

Co-pending U.S. Appl. No. 13/412,870, titled Selective Metalization of Electrical Connector or Socket Housing, filed Mar. 6, 2012.

Co-pending U.S. Appl. No. 13/413,032, titled Bumped Semiconductor Wafer or Die Level Electrical Interconnect, filed Mar. 6, 2012.

Co-pending U.S. Appl. No. 13/413,724, titled Copper Pillar Full Metal Via Electrical Circuit Structure, filed Mar. 7, 2012.

Co-pending U.S. Appl. No. 13/418,853, titled High Performance Surface Mount Electrical Interconnect With External Biased Normal Force Loading, filed Mar. 13, 2012.

Notification of Transmittal of the International Search Report and the Written Opinion of the International Searching Authority mailed Apr. 5, 2012 in International Application No. PCT/US2011/062321.

Notification of Transmittal of the International Search Report and the Written Opinion of the International Searching Authority mailed Mar. 29, 2012 in International Application No. PCT/US2011/063247.

Notification of Transmittal of the International Search Report and the Written Opinion of the International Searching Authority mailed Jun. 20, 2012 in International Application No. PCT/US2012/027813.

Notification of Transmittal of the International Search Report and the Written Opinion of the International Searching Authority mailed Jun. 19, 2012 in International Application No. PCT/US2012/027823.

Co-pending U.S. Appl. No. 13/448,865, titled Compliant Conductive Nano-Particle Electrical Interconnect, filed Apr. 17, 2012.

Co-pending U.S. Appl. No. 13/448,914, titled Compliant Core Peripheral Lead Semiconductor Test Socket, filed Apr. 17, 2012.

Co-pending U.S. Appl. No. 13/575,368, titled High Speed Backplane Connector, filed Jul. 26, 2012.

Notification of Transmittal of the International Search Report and the Written Opinion of the International Searching Authority issued Jul. 30, 2010 in International Application No. PCT/US2010/036043.

(56) References Cited

OTHER PUBLICATIONS

Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Complaint Printed Circuit Semiconductor Tester Interface, filed Nov. 7, 2011.
Co-pending U.S. Appl. No. 13/319,228, titled Singulated Semiconductor Device Separable Electric Interconnect, filed Nov. 7, 2011.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.

(56) References Cited

OTHER PUBLICATIONS

Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.

\* cited by examiner

COMPLIANT PRINTED CIRCUIT SEMICONDUCTOR PACKAGE

TECHNICAL FIELD

The present application is directed to a simulated or actual semiconductor package that leverages the capabilities of additive printing processes to provide a high performance package capable of interconnecting single or multiple devices in a permanent or separable fashion.

BACKGROUND OF THE INVENTION

Traditional semiconductors and IC devices are typically packaged in a variety of ways to provide redistribution from the terminals on the die to a spacing that is conducive to cost effective printed circuit board ("PCB") fabrication techniques. In many cases, the size and distance between die terminals is so small that the device cannot be connected to the final PCB without some sort of fan out or routing. The packages also serve to protect the fragile silicon or provide additional functions such as thermal management or near device decoupling. In many cases, the size and distance between die terminals is so small that the IC device cannot be connected to the final PCB without some sort of re-routing interface.

Most IC devices are produced with terminals in either a peripheral pattern that runs along the edges of the IC device or an area array pattern that spans across the surface of the IC device. A main method for attachment when the terminals are in an area array pattern is to connect the terminals with solder. Basically, the package has an array of terminals that correspond to the IC device terminals. Solder is applied the terminals on the IC device and/or the package and reflowed to create the mechanical and electrical connection in a process commonly called flip chip attachment. In a flip chip attachment the IC device is flipped over to mate the terminals on the die to the terminals on the IC package substrate.

The IC devices in these types of packages are often under filled with an epoxy of some type to provide support and strength to the solder joints. The epoxy protects the solder joints during use from thermal expansion, miss-match and/or shock. In both cases, the connection of the IC device to the package is generally not reworkable once packaged and if there is a missing or broken connection it is difficult to repair.

Once the IC devices are packaged, they are usually tested in a variety of ways to determine the reliability and performance of the IC devices in the package as they would be used in the final application. In many cases, the functional performance of the IC device is not known prior to placing it into the package and if the packaged IC device fails testing the cost of the package and processing is lost.

Area array packaging has been utilized for many years, and provides a method for interconnecting IC devices with larger terminal counts than peripheral lead packaging. In general, the area array packaging is more expensive due to the larger pin counts and more sophisticated substrates required. The main limitations for area array packaging are the terminal pitch, thermal management, cost, ability to rework faulty IC devices and reliability of the solder joints.

There also have been advancements in recent years in both package types where multiple IC devices are placed in the same package, creating what has been nicknamed SiP or "system in package". Placing multiple IC devices in a single package further complicates the problems discussed above.

BRIEF SUMMARY OF THE INVENTION

The present disclosure is directed to providing a simulated or actual semiconductor package that leverages the capabilities of additive printing processes to provide a high performance package capable of interconnecting a single or multiple IC devices in a permanent or separable fashion. The present semiconductor package preferably permits the IC devices to be tested prior to final packaging.

The present compliant printed circuit semiconductor package resembles a traditional package in construction, but utilizes additive printing processes rather than conventional subtractive processes. The unique nature of the additive printing processes allows for a direct writing of circuitry and dielectrics, with the added benefit of stress decoupling at the terminal joints as well as embedded function not seen in traditional packaging.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

One embodiment is directed to a package for at least one semiconductor device and a method for making the package. At least one dielectric layer is selectively printed on at least a portion of the semiconductor device creating first recesses aligned with a plurality of the electrical terminals. A conductive material is printed in the first recesses forming contact members on the semiconductor device. At least one dielectric layer is selectively printed on at least a portion of the package to create a plurality of second recesses corresponding to a target circuit geometry. A conductive material is printed in at least a portion of the second recesses to create a circuit geometry. The circuit geometry includes a plurality of exposed terminals electrically coupled to the electric terminals on the semiconductor device.

Conductive plating is preferably added to one or more of the contact members and the circuit geometry. The conductive material can be sintered conductive particles or a conductive ink. In one embodiment, a compliant material is located between the exposed terminals and the substrate. In another embodiment, at least one electrical device is printed on one of a dielectric layer or the substrate and electrically coupled to at least a portion of the circuit geometry. The exposed terminals preferably extend above the package.

The resulting circuit geometry preferably has conductive traces that have substantially rectangular cross-sectional shapes, corresponding to the second recesses. The use of additive printing processes permit conductive material, non-conductive material, and semi-conductive material to be located on a single layer.

In one embodiment, pre-formed conductive trace materials are located in the second recesses. The second recesses are than plated to form conductive traces with substantially rectangular cross-sectional shapes. In another embodiment, a conductive foil is pressed into at least a portion of the second recesses. The conductive foil is sheared along edges of the second recesses. The excess conductive foil not located in the second recesses is removed and the second recesses are plated to form conductive traces with substantially rectangular cross-sectional shapes.

In another embodiment, at least one external dielectric layer extends beyond the package. External routing is printed on the external dielectric layer and electrically coupled to a portion of the circuit geometry.

The package can include a plurality of semiconductor devices. The circuit geometry may include at least one of an inter-die circuit path or an intra-die circuit paths. The semiconductor devices are optionally arranged in a stacked configuration.

The present disclosure is also directed to an electrical assembly including a circuit member with a plurality of contact pads electrically coupled to the exposed terminals on the package. The circuit member can be selected from one of a dielectric layer, a printed circuit board, a flexible circuit, a bare die device, an integrated circuit device, organic or inorganic substrates, or a rigid circuit.

This present compliant printed semiconductor package enables internal and/or external compliance to enhance the mechanical performance of the circuit. The present semiconductor package can be produced digitally, without tooling or costly artwork. The semiconductor package can be produced as a "Green" product, with dramatic reductions in environmental issues related to the production of conventional semiconductor packages.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the compliant printed semiconductor package reduces parasitic electrical effects and impedance mismatch, potentially increasing the current carrying capacity.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

The compliant printed semiconductor package can be configured with conductive traces that reduce or redistribute the terminal pitch, without the addition of an interposer or daughter substrate. Grounding schemes, shielding, electrical devices, and power planes can be added to the semiconductor package, reducing the number of connections to the PCB and relieving routing constraints while increasing performance.

DETAILED DESCRIPTION OF THE INVENTION

Figure 1:
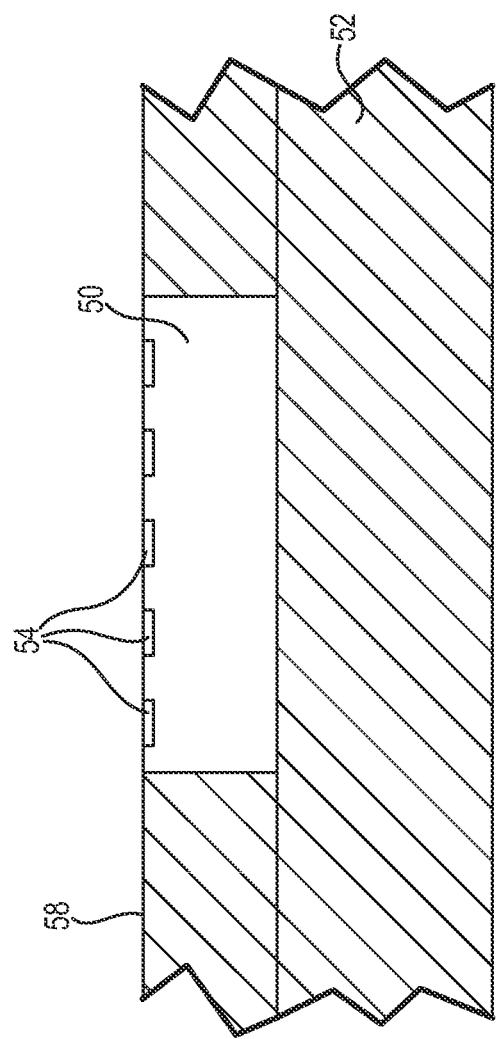
FIG. 1 is a cross-sectional view of a method of making a compliant printed semiconductor package in accordance with an embodiment of the present disclosure.

FIG. 1 is a side sectional view of IC device 50 located on substrate 52 with IC terminals 54 facing up. The substrate 52 may be a temporary work surface or may be a portion of the final semiconductor package. The substrate 52 can be constructed from a variety of rigid or flexible polymeric materials, such as for example, UV stabilized tetrafunctional epoxy resin systems referred to as Flame Retardant 4 (FR-4); bis-maleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyester (PET), polyimide (PI), polyethylene napthalate (PEN), Polyetherimide (PEI), along with various fluoropolymers (FEP) and copolymers, and Ryton® available from Phillips Petroleum Company. For some applications, the substrate 52 can be a polyimide film due to their advantageous electrical, mechanical, chemical, and thermal properties.

Figure 2:
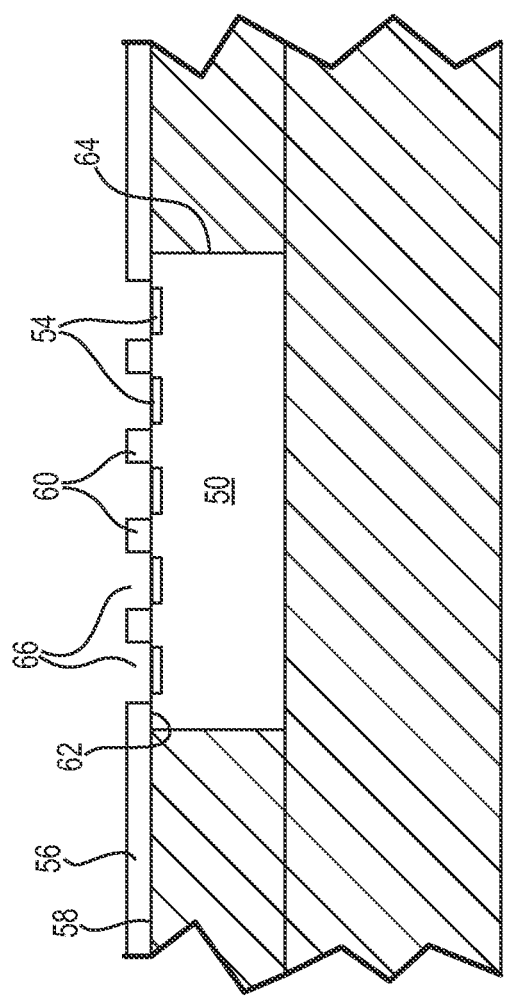
FIG. 2 illustrates a method of printing dielectric material on the semiconductor package of FIG. 1.

FIG. 2 illustrates printed layer 56 printed to top surface 58 of the substrate 52 and at locations 60 between IC terminal 54. In the illustrate embodiment, the cover layer 56 overlaps edges 62 the IC device 50 and helps to retain it in recess 64 in the substrate 52. The printed layer 56 at locations 60 creates one or more recesses 66 corresponding to each of the IC terminals 54 that are used in subsequent steps of the process.

Figure 3:
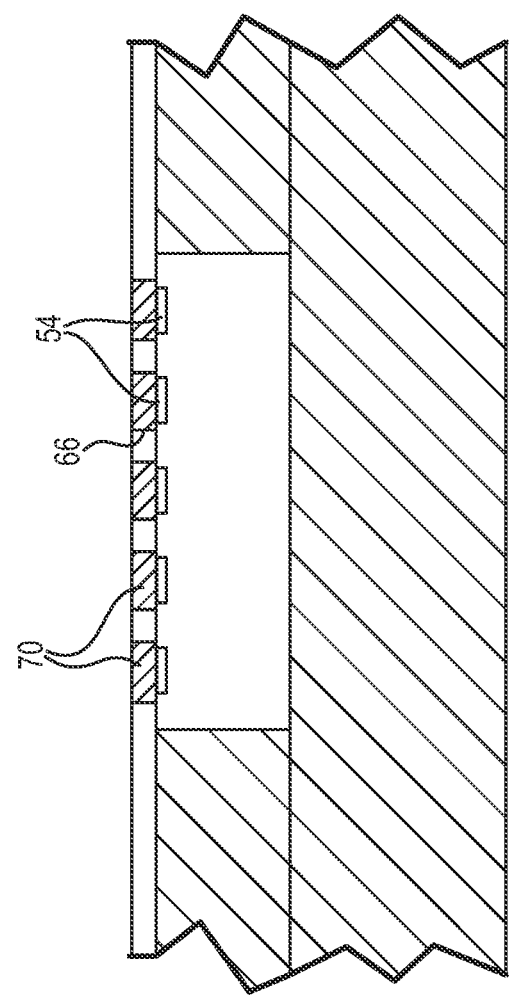
FIG. 3 illustrates a method of printing contact members on the semiconductor package of FIG. 1.

As illustrated in FIG. 3, the recesses 66 for the IC terminals 54 are metalized to create contact members 70. Metalizing can be performed by printing conductive particles followed by a sintering step, by printing conductive inks, or a variety of other techniques. The metalizing material is preferably of copper or similar metallic materials such as phosphor bronze or beryllium-copper. The resulting contact members 70 are optionally plated to improve conductive properties. The plating is preferably a corrosion resistant metallic material such as nickel, gold, silver, palladium, or multiple layers thereof.

Figure 4:
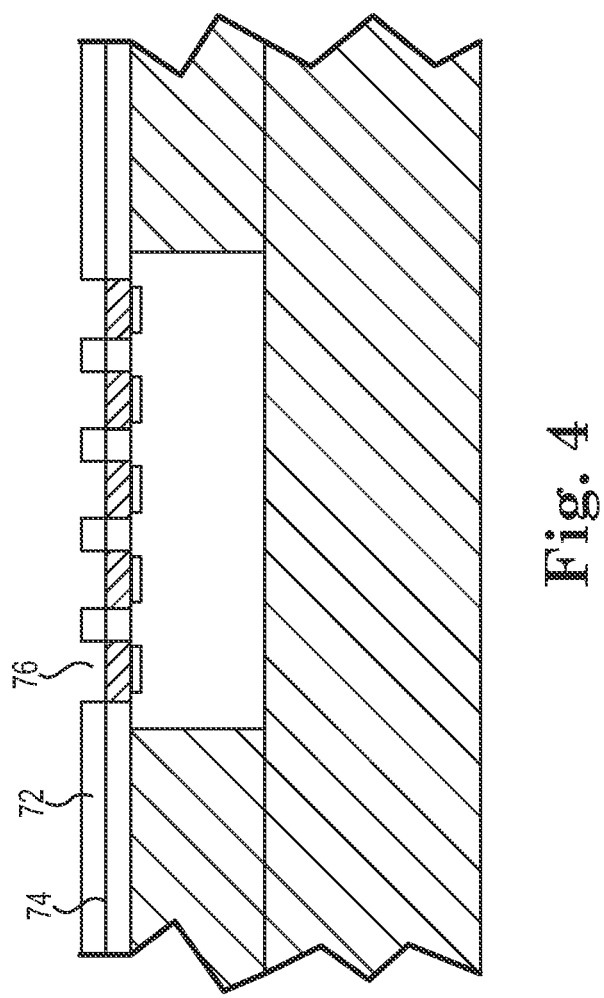
FIGS. 4 and 5 illustrate a method of printing circuit geometry on the semiconductor package of FIG. 1.
Figure 5:
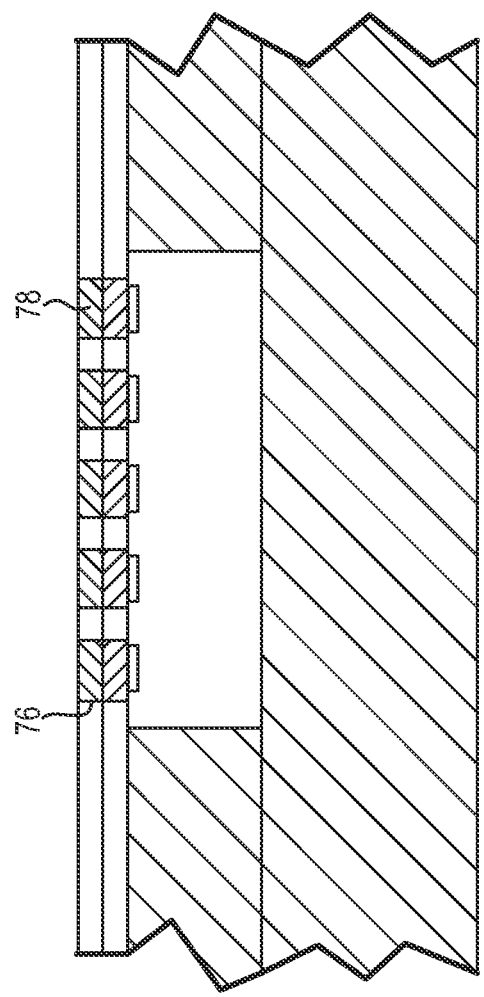

As illustrated in FIG. 4, dielectric layer 72 is printed on surface 74 with recesses 76 corresponding to a desired circuit geometry. Alternatively, the dielectric layer 72 is placed on surface 74. The recesses 76 can be defined by printing, embossing, imprinting, chemical etching with a printed mask, or a variety of other techniques. As illustrated in FIG. 5, the recesses 76 are metalized as discussed above to create circuit geometry 78.

In one embodiment, the circuit geometry 78 is formed by depositing a conductive material in a first state in the recesses 76, and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

The recesses 66, 76 in the layers 56, 72, 82, 84, 86 permit control of the location, cross section, material content, and aspect ratio of the contact members 70 and the conductive traces in the circuit geometry 78. Maintaining the conductive traces with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 66, 76 to control the aspect ratio of the conductive traces results in a more rectangular or square cross-section of the conductive traces in the circuit geometry 78, with the corresponding improvement in signal integrity.

In another embodiment, pre-patterned or pre-etched thin conductive foil circuit traces are transferred to the recesses 66, 76. For example, a pressure sensitive adhesive can be used to retain the copper foil circuit traces in the recesses 66, 76. The trapezoidal cross-sections of the pre-formed conductive foil traces are then post-plated. The plating material fills the open spaces in the recesses 66, 76 not occupied by the foil circuit geometry, resulting in a substantially rectangular or square cross-sectional shape corresponding to the shape of the recesses 66, 76.

In another embodiment, a thin conductive foil is pressed into the recesses 64, 76, and the edges of the recesses 66, 76 act to cut or shear the conductive foil. The process locates a portion of the conductive foil in the trenches 66, 76, but leaves the negative pattern of the conductive foil not wanted outside and above the trenches 66, 76 for easy removal. Again, the foil in the trenches 66, 76 is preferably post plated to add material to increase the thickness of the conductive traces in the circuit geometry 78 and to fill any voids left between the conductive foil and the recesses 66, 76.

Figure 6:
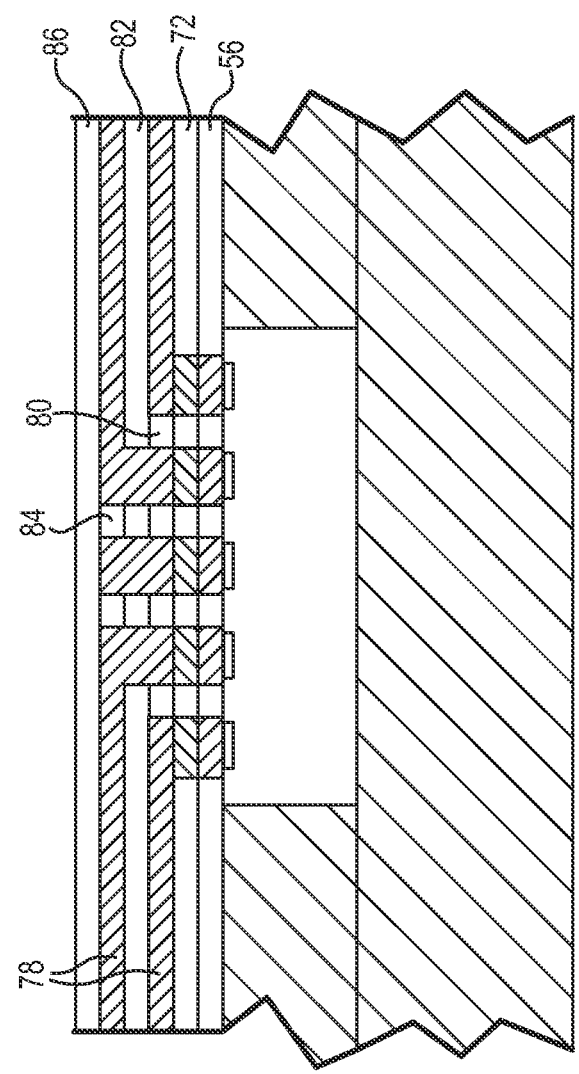
FIG. 6 illustrates a compliant printed semiconductor package in accordance with an embodiment of the present disclosure.

FIG. 6 illustrates additional printed dielectric layers 80, 82, 84, 86 creating additional recesses that are metalized to extend the circuit geometry 78. The dielectric layer 56, 72, 80, 82, 84, 86 may be constructed of any of a number of dielectric materials that provide electrostatic dissipation or to reduce cross-talk between the traces of the circuit geometry 62. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 7:
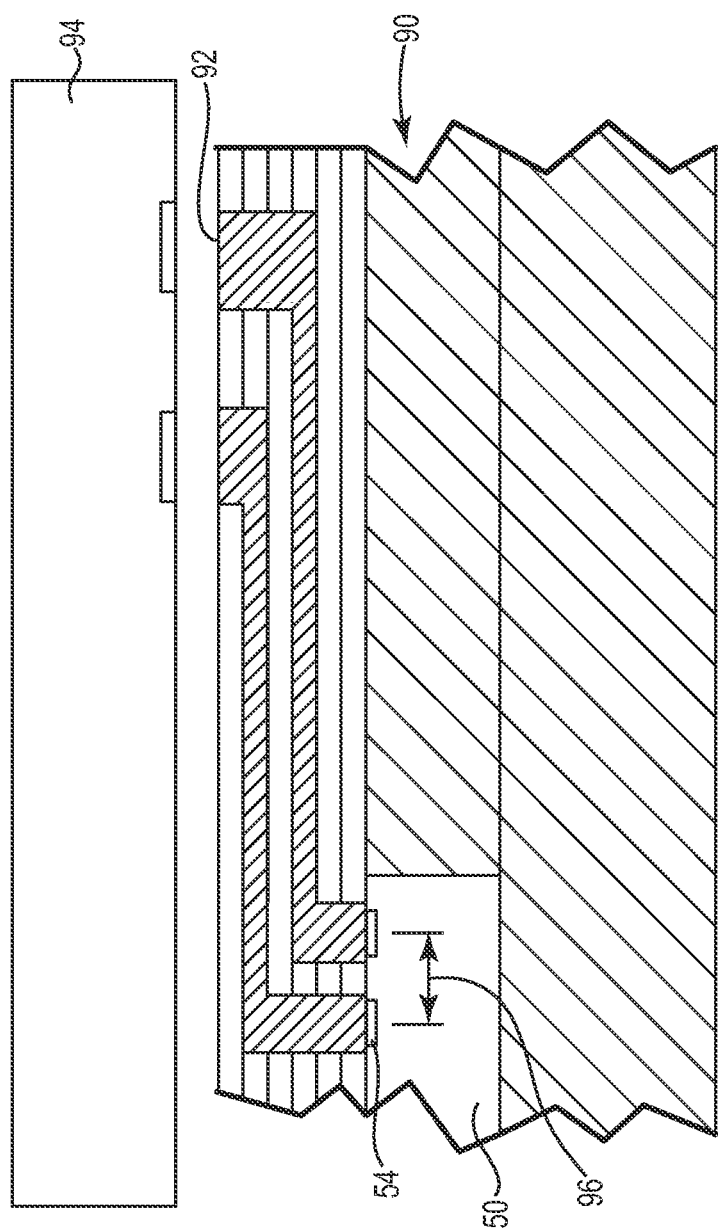
FIG. 7 illustrates the compliant printed semiconductor package of FIG. 6 coupled to a circuit member in accordance with an embodiment of the present disclosure.

FIG. 7 illustrates the circuit geometry 78 routing the IC terminals 54 out of semiconductor package 90. The size and pitch of exposed terminals 92 are printed to electrically couple the IC device 50 to another circuit member 94, such as a printed circuit board or a socket. The semiconductor package 90 permits fine contact-to-contact spacing 96 (pitch) on the order of less than 1.0 mm pitch, and more preferably a pitch of less than about 0.7 millimeter, and most preferably a pitch of less than about 0.4 millimeter.

The present semiconductor package 90 permits the performance of the IC device 50 to be evaluated before being incorporated into a system in package or multi-chip module before final packaging, permitting the individual die to be replaced if necessary. The additive process disclosed herein also permits the circuit geometry 78 to be written directly on the IC device 50, without the need of the intermediate die bonding step.

Figure 8:
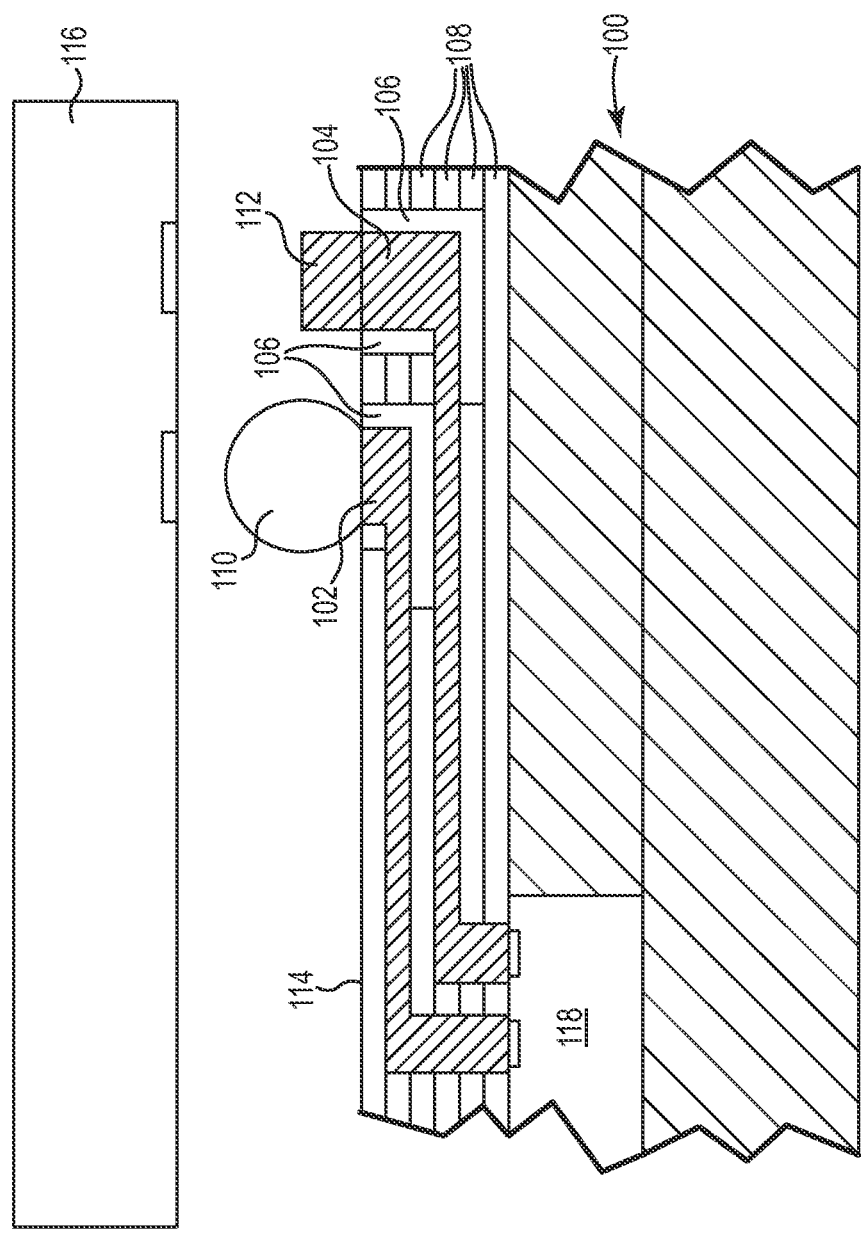
FIG. 8 illustrates an alternate compliant printed semiconductor package with printed compliant regions in accordance with an embodiment of the present disclosure.

FIG. 8 illustrates an alternate semiconductor package 100 with modified terminals 102, 104 in accordance with an embodiment of the present disclosure. Resilient regions 106 are preferably printed during the creation of layers 108. In the preferred embodiment, dielectric material is printed to leave a recess into which the resilient materials are deposited, preferably by printing. The resilient regions 106 permit the terminals 102, 104 to move in all six degrees of freedom (X-Y-Z-Pitch-Roll-Yaw) to facilitate electrical coupling with circuit member 116.

The resilient regions 106 increase the compliance of the modified terminals to permit electrical coupling by compression, without the need to solder the semiconductor package 100. The semiconductor package 100 permits IC device 118 to be tested prior to final packaging, dramatically improving yields. In one embodiment, solder ball 110 is located on terminal 102. In another embodiment, conductive material 112 is printed on the terminal so it extends above surface 114 of the semiconductor package 100.

The embodiment of FIG. 8 can be pressed against circuit member 116 and powered without the need for a socket. Alternatively, the semiconductor package 100 can be inserted into an LGA or BGA socket, or soldered to circuit member 116. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

Figure 9:
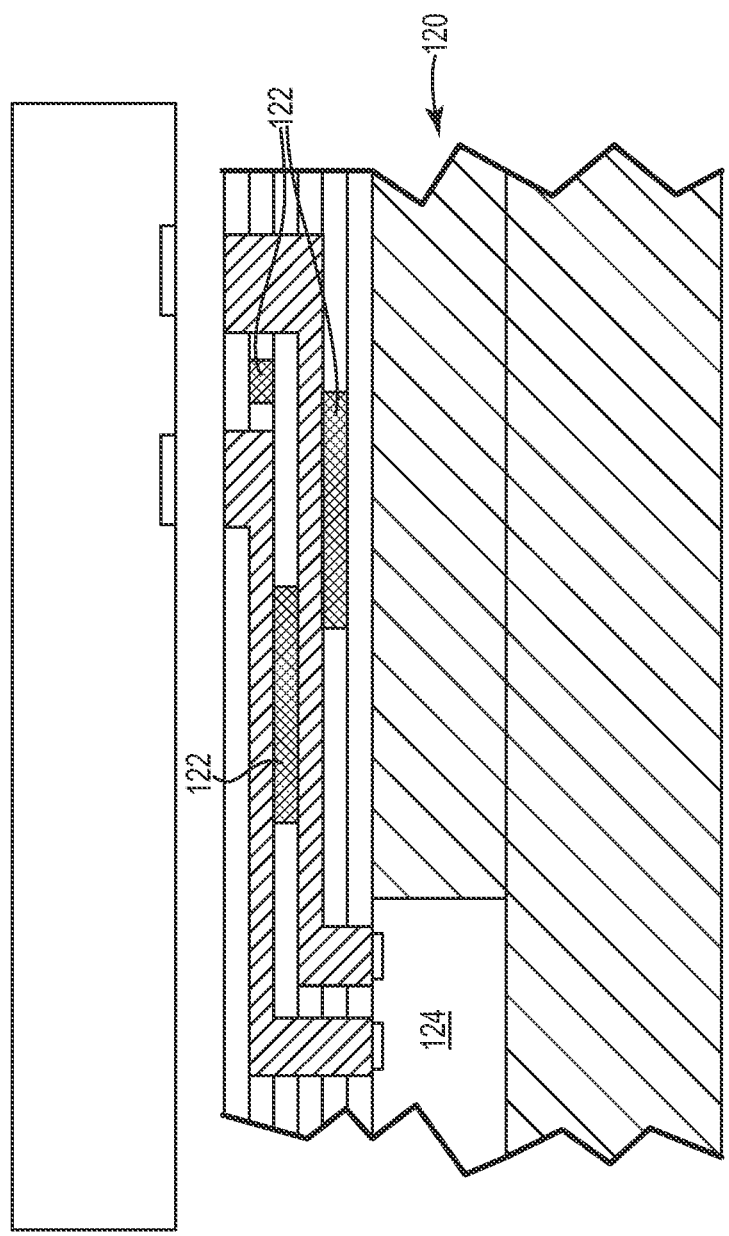
FIG. 9 illustrates an alternate compliant printed semiconductor package with printed electrical devices in accordance with an embodiment of the present disclosure.

FIG. 9 illustrates an alternate semiconductor package 120 with printed electrical devices 122 in accordance with an embodiment of the present disclosure. The electrical devices 122 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

The electrical devices 122 are preferably printed during construction of the semiconductor package 120. The electrical devices 122 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 122 can be formed using printing technology, adding intelligence to the semiconductor package 120. Features that are typically located on the IC device 124 can be incorporated into the semiconductor package 120 in accordance with an embodiment of the present disclosure.

The availability of printable silicon inks provides the ability to print electrical devices 122, such as disclosed in U.S. Pat. Nos. 7,485,345 (Renn et al.); 7,382,363 (Albert et al.); 7,148,128 (Jacobson); 6,967,640 (Albert et al.); 6,825,829 (Albert et al.); 6,750,473 (Amundson et al.); 6,652,075 (Jacobson); 6,639,578 (Comiskey et al.); 6,545,291 (Amundson et al.); 6,521,489 (Duthaler et al.); 6,459,418 (Comiskey et al.); 6,422,687 (Jacobson); 6,413,790 (Duthaler et al.); 6,312,971 (Amundson et al.); 6,252,564 (Albert et al.); 6,177,921 (Comiskey et al.); 6,120,588 (Jacobson); 6,118,426 (Albert et al.); and U.S. Pat. Publication No. 2008/0008822 (Kowalski et al.), which are hereby incorporated by reference. In particular, U.S. Pat. Nos. 6,506,438 (Duthaler et al.) and 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 202 can also be created by aerosol printing, such as disclosed in U.S. Pat. Nos. 7,674,671 (Renn et al.); 7,658,163 (Renn et al.); 7,485,345 (Renn et al.); 7,045,015 (Renn et al.); and 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

In one embodiment, a plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a substrate, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 10:
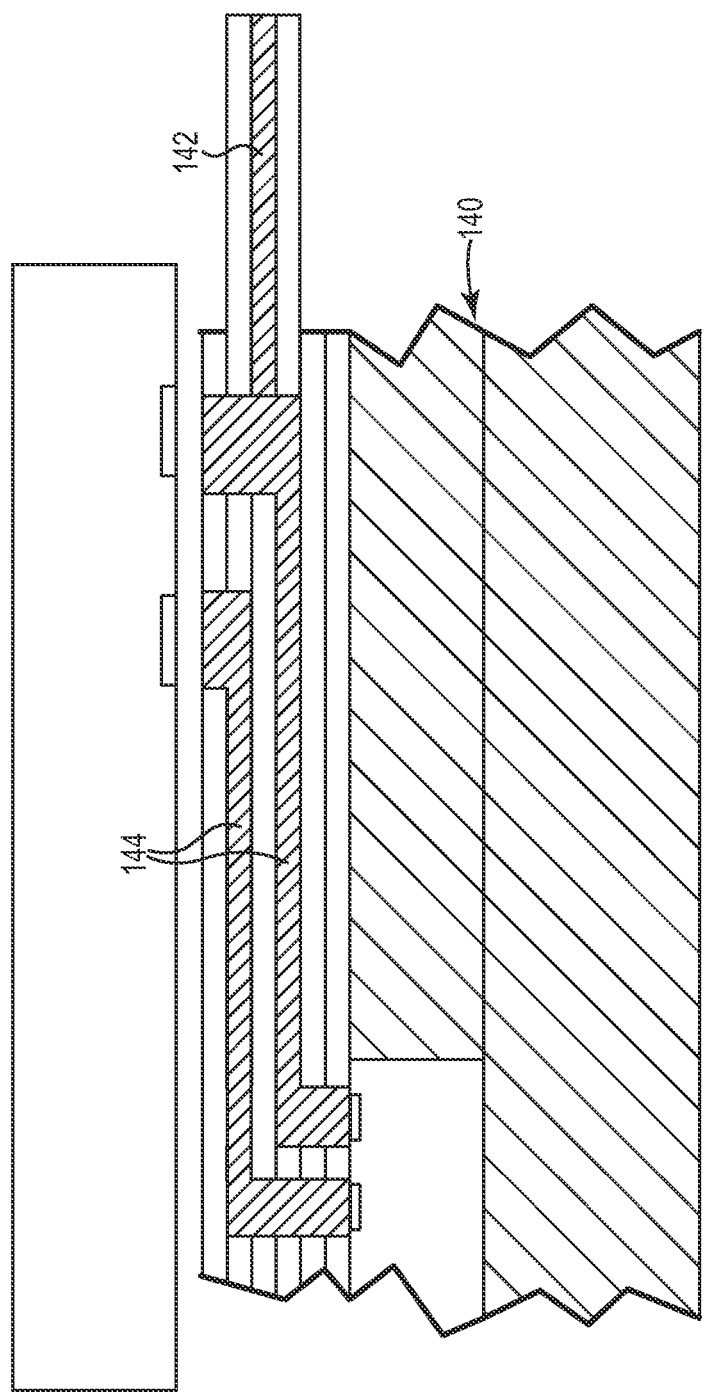
FIG. 10 illustrates an alternate compliant printed semiconductor package with printed external routing in accordance with an embodiment of the present disclosure.

FIG. 10 illustrates an alternate semiconductor package 140 with external routing 142 in accordance with an embodiment of the present disclosure. The external routing 142 is preferably an extension of circuit geometer 144 made using the printing technology discussed above. The external routing 142 can be constructed to accommodate connection to desired functions, such as for example, power management and delivery, tester interface, functional display or indicators, and the like.

Figure 11:
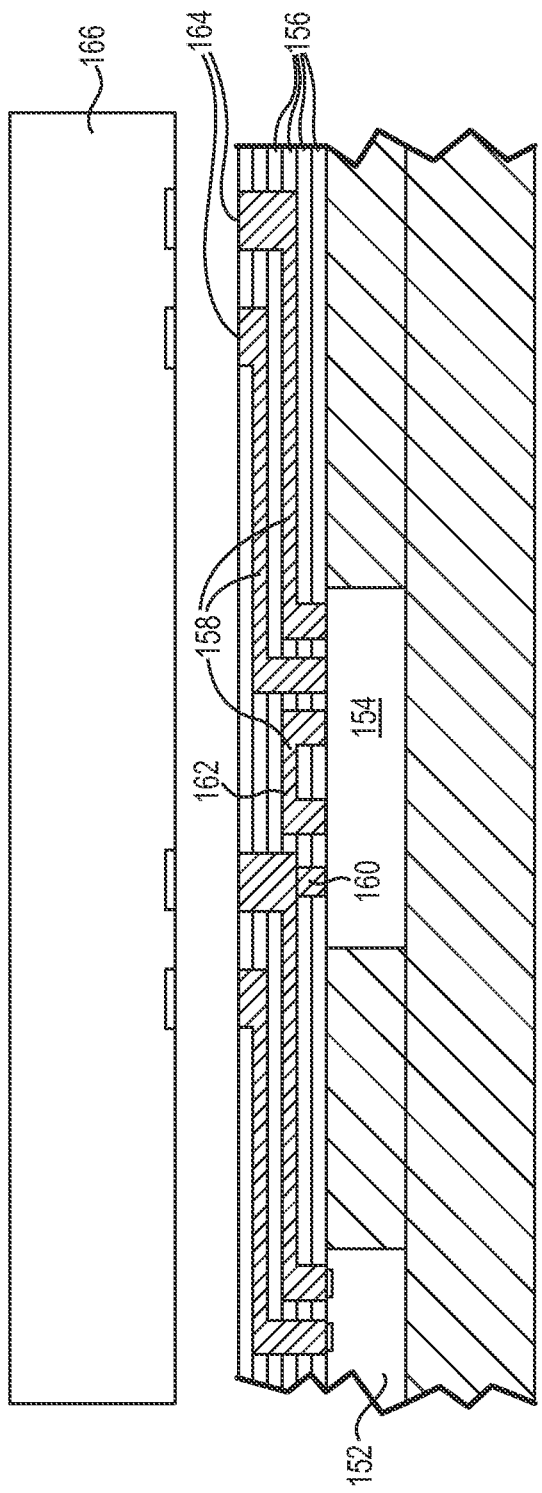
FIG. 11 illustrates a multichip compliant printed semiconductor package in accordance with an embodiment of the present disclosure.

FIG. 11 illustrates a semiconductor package 150 that simulates a system in package (SIP) or multichip module format, in accordance with an embodiment of the present disclosure. Multiple IC devices 152, 154 are located in the semiconductor package 150. Dielectric layers 156 and circuit geometry 158 are printed as discussed above. The circuit geometry 158 permits inter-die circuit paths 160 and intra-die circuit paths 162. Contact pads 164 can be configured in a variety of ways to couple with circuit member 166.

Figure 12:
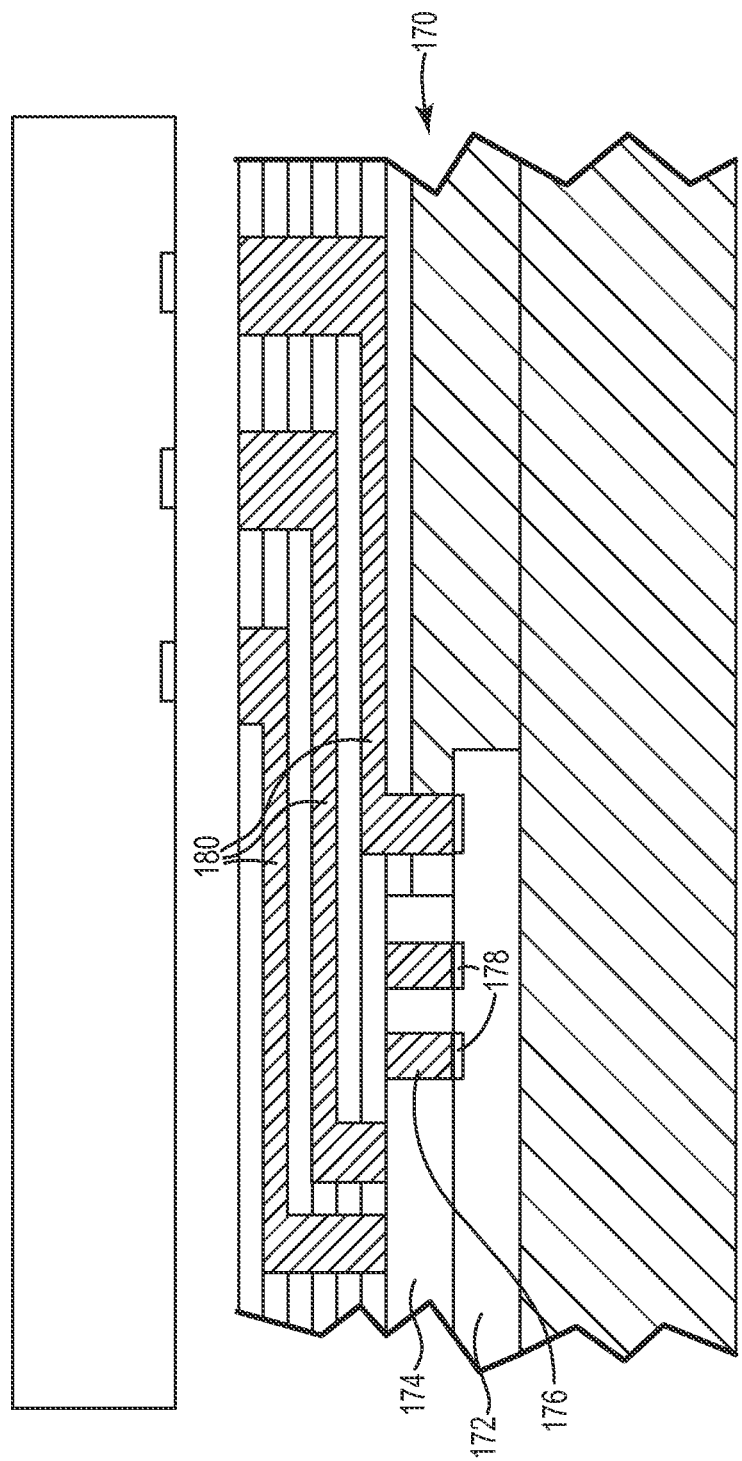
FIG. 12 illustrates a stacked multichip compliant printed semiconductor package in accordance with an embodiment of the present disclosure.

FIG. 12 illustrates a semiconductor package 170 with stacked IC devices 172, 174 in accordance with an embodiment of the present disclosure. Through silicon vias 176 permit contact pads 178 on IC device 172 to electrically couple with circuit geometry 180 and/or IC device 174. The through silicon vias 176 eliminate edge wiring and permit a shorter vertical stack. The through silicon vias 176 can be formed using the printing processes discussed herein or other methods.

Figure 13:
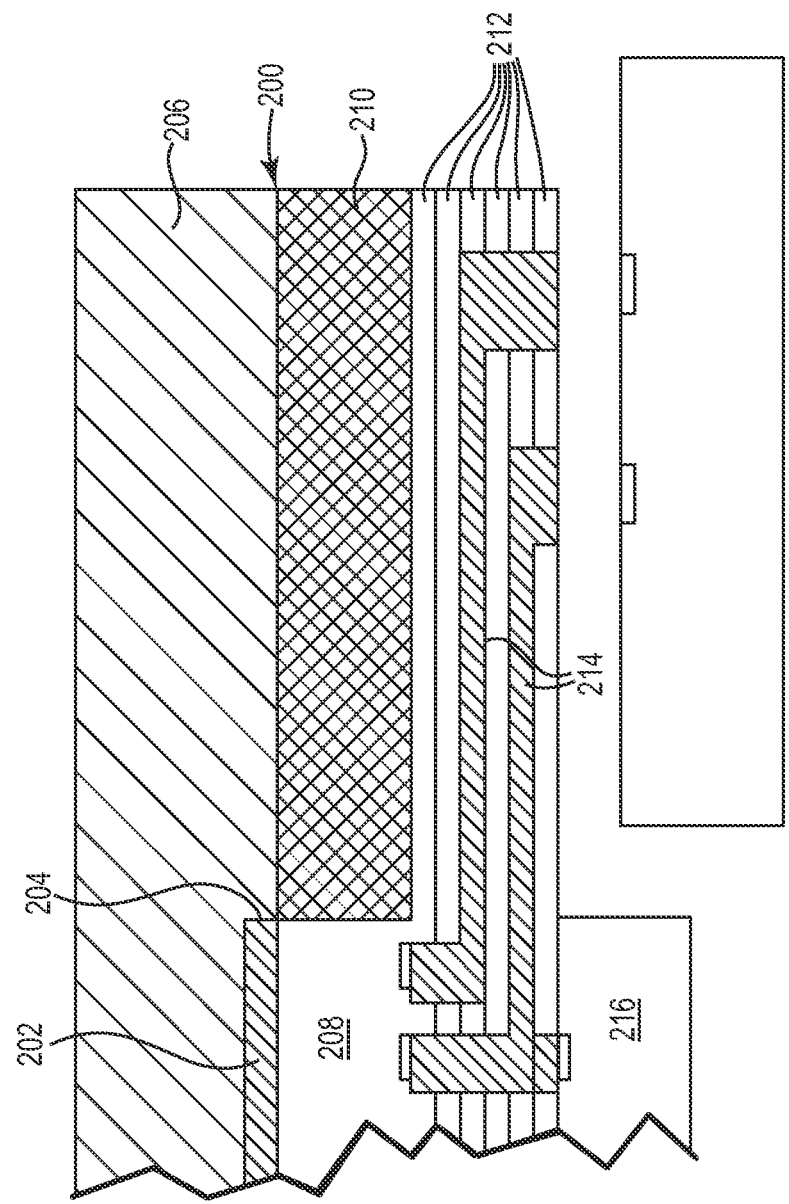
FIG. 13 illustrates a layered multichip compliant printed semiconductor package in accordance with an embodiment of the present disclosure.

FIG. 13 illustrates an alternate semiconductor package 200 in accordance with an embodiment of the present disclosure. RF shielding 202 is optionally printed in recess 204 of substrate 206. In one embodiment, substrate 206 is optimized for thermal management. In another embodiment, IC device 208 is retained to substrate 206 by overmolding or encapsulation 210.

Dielectric layers 212 and circuit geometry 214 are preferably printed as discussed above. In the embodiment of FIG. 13, the circuit geometry 214 is configured to add additional IC device 216 in a double sided configuration. Alternatively, the semiconductor package 200 can be mated with another assembly to create a complex system in package or multichip module.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either or both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A package for a semiconductor device having electrical terminals, the package comprising:
   a substrate including at least one semiconductor device;
   a first dielectric layer selectively printed on at least a portion of the semiconductor device comprising first recesses aligned with a plurality of the electrical terminals;
   a conductive material printed in the first recesses forming contact members on the semiconductor device;

a second dielectric layer selectively printed on at least a portion of the first dielectric layer comprising second recesses aligned with a plurality of the first recesses;

a conductive material printed in at least a portion of the second recesses comprising a circuit geometry;

a third dielectric layer selectively printed on at least a portion of the second dielectric layer comprising third recesses aligned with a portion of the circuit geometry;

a conductive material printed in the third recesses comprising a plurality of exposed terminals that are offset from, and electrically coupled to the electric terminals on the semiconductor device by the circuit geometry; and a compliant material deposited in recesses in one or more of the first, second or third dielectric layers adjacent to a plurality of the exposed terminals to permit the exposed terminals to move within the dielectric layers relative to the substrate.

2. The package of claim 1 comprising a conductive plating layer on one or more of the contact members, the exposed terminals, and the circuit geometry.

3. The package of claim 1 wherein the conductive material comprises one of sintered conductive particles or a conductive ink.

4. The package of claim 1 comprising a compliant material located between the exposed terminals and the substrate.

5. The package of claim 1 comprising at least one printed electrical device on one of a dielectric layer or the substrate and electrically coupled to at least a portion of the circuit geometry.

6. The package of claim 1 wherein the exposed terminals extend above the package.

7. The package of claim 1 comprising a plurality of vias electrically coupling adjacent layers of the circuit geometry.

8. The package of claim 1 comprising:
at least one external dielectric layer extending beyond the package; and
external routing on the external dielectric layer electrically coupled to a portion of the circuit geometry.

9. The package of claim 1 comprising a plurality of semiconductor devices received by the substrate, wherein the circuit geometry comprises at least one of an inter-die circuit path or an intra-die circuit paths.

10. The package of claim 1 comprising:
at least two vertically stacked semiconductor devices; and
a plurality of through silicon vias electrically coupling at least two of the stacked semiconductor devices.

11. The package of claim 1 comprising a plurality of semiconductor devices receive by the substrate and electrically coupled by the circuit geometry.

12. The package of claim 1 wherein conductive traces in the circuit geometry comprise substantially rectangular cross-sectional shapes.

13. The package of claim 1 wherein a conductive material, a non-conductive material, and a semi-conductive material are printed on a single layer.

14. An electrical assembly comprising:
the package of claim 1; and
a circuit member with a plurality of contact pads electrically coupled to the exposed terminals on the package.

15. The electrical interconnect assembly of claim 14 wherein the circuit member is selected from one of a dielectric layer, a printed circuit board, a flexible circuit, a bare die device, an integrated circuit device, organic or inorganic substrates, or a rigid circuit.

16. A package for a semiconductor device having electrical terminals, the package comprising:
at least one first dielectric layer selectively printed directly on at least a portion of the semiconductor device creating first recesses aligned with a plurality of the electrical terminals;
a conductive material located in the first recesses forming contact members that are electrically coupled to the electric terminals on the semiconductor device;
at least one second dielectric layer selectively printed on at least one first dielectric layer to create a plurality of second recesses corresponding to a target circuit geometry;
a conductive material located in at least a portion of the second recesses comprising circuit geometry located on the semiconductor device, the circuit geometry comprising a plurality of exposed terminals that are offset from, and electrically coupled to the contact members by the circuit geometry; and
a compliant material deposited in additional recesses in one or more of the first or second dielectric layers adjacent to a plurality of the exposed terminals, wherein the complaint material permits the exposed terminals to move within the dielectric layers relative to the substrate.

17. The package of claim 16 comprising:
a substrate supporting the semiconductor device; and
encapsulating material retaining the semiconductor device to the substrate, whereby the semiconductor device is electrically accessible via the exposed terminals.

18. The package of claim 1 wherein the resilient material permits the exposed terminal to move relative to the substrate.

19. The package of claim 1 wherein the resilient material permits the exposed terminal to move in at least three degrees of freedom relative to the substrate.

* * * * *